United States Patent [19]
Kuriyama

[11] Patent Number: 5,644,281
[45] Date of Patent: *Jul. 1, 1997

[54] ELECTRONIC COMPONENT INCORPORATING SOLDER FUSE WIRE

[75] Inventor: Chojiro Kuriyama, Kyoto, Japan

[73] Assignee: Rohm Co., Ltd., Kyoto, Japan

[*] Notice: The term of this patent shall not extend beyond the expiration date of Pat. No. 5,402,307.

[21] Appl. No.: 310,063

[22] Filed: Sep. 19, 1994

Related U.S. Application Data

[63] Continuation-in-part of Ser. No. 209,314, Mar. 14, 1994, Pat. No. 5,402,307, which is a continuation of Ser. No. 41,971, Apr. 2, 1993, Pat. No. 5,315,474.

[30] Foreign Application Priority Data

| Apr. 7, 1992 | [JP] | Japan | 4-85353 |
| Sep. 21, 1993 | [JP] | Japan | 5-234629 |
| Mar. 16, 1994 | [JP] | Japan | 6-045899 |

[51] Int. Cl.⁶ ............................. H01H 85/04; H01G 9/05
[52] U.S. Cl. ........................... 337/295; 337/405; 361/534
[58] Field of Search ........................ 337/401, 405, 337/406, 298, 295, 297; 257/665, 696, 712, 750, 788; 361/534

[56] References Cited

U.S. PATENT DOCUMENTS

| 3,882,059 | 5/1975 | Elderbaum | 361/329 |
| 4,090,231 | 5/1978 | Millard et al. | 361/529 |
| 4,097,916 | 6/1978 | Piper | 361/540 |
| 4,106,184 | 8/1978 | Fournier et al. | 361/534 |
| 4,319,304 | 3/1982 | Fink | 361/307 |
| 4,935,848 | 6/1990 | Yamane et al. | 361/534 |
| 4,945,398 | 7/1990 | Kurita et al. | 257/665 |
| 5,002,217 | 3/1991 | Tani et al. | 219/56.21 |
| 5,099,397 | 3/1992 | Edson et al. | 361/534 |
| 5,177,674 | 1/1993 | Sugisaki | 361/534 |
| 5,295,619 | 3/1994 | Takahashi et al. | 228/180.5 |
| 5,402,307 | 3/1995 | Kuriyama | 361/534 |

FOREIGN PATENT DOCUMENTS

| 0169574 | 1/1986 | European Pat. Off. . |
| 306809 | 3/1989 | European Pat. Off. . |
| 0446937 | 9/1991 | European Pat. Off. . |
| 519330 | 12/1992 | European Pat. Off. . |
| 2353100 | 5/1974 | Germany . |
| 2608250 | 9/1977 | Germany . |
| 2618867 | 11/1977 | Germany . |
| 2758890 | 8/1978 | Germany . |
| 4317131 | 11/1993 | Germany . |
| 0022019 | 1/1989 | Japan | 361/534 |
| 2-234457 | 3/1989 | Japan . |
| 2-105513 | 4/1990 | Japan . |
| 5-259211 | 3/1992 | Japan . |

OTHER PUBLICATIONS

Japanese publication entitled "Solid Tantalum Capacitor for product safety," (NEC) vol. 44, No. 10/1991, pp. 116–120.

Primary Examiner—Michael W. Phillips
Assistant Examiner—Jayprakash N. Gandhi
Attorney, Agent, or Firm—William H. Eilberg

[57] ABSTRACT

An electronic component is provided which includes at least one chip element having at least two poles; and at least two leads respectively connected electrically to the two poles. At least one of the two leads is electrically connected to a corresponding one of the two poles through a solder fuse wire which has a nail head end and a flattened discal end.

8 Claims, 14 Drawing Sheets

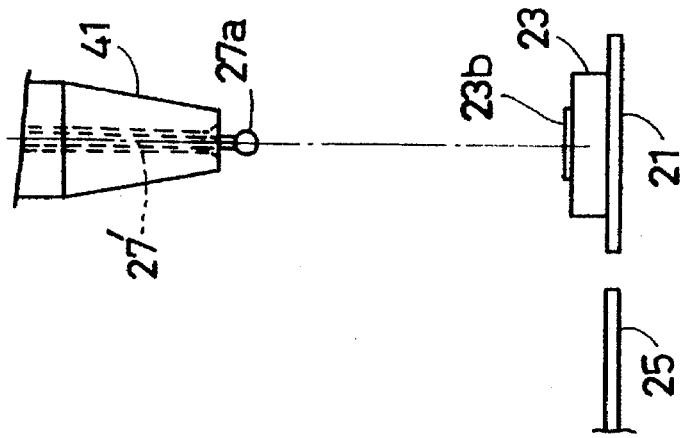
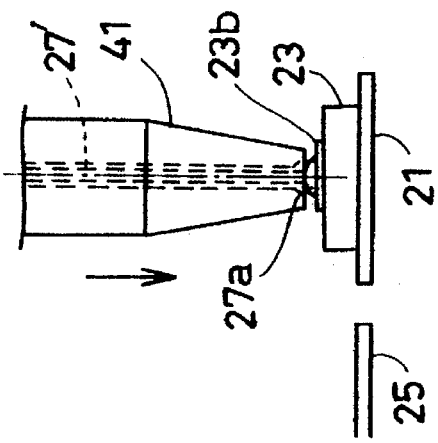
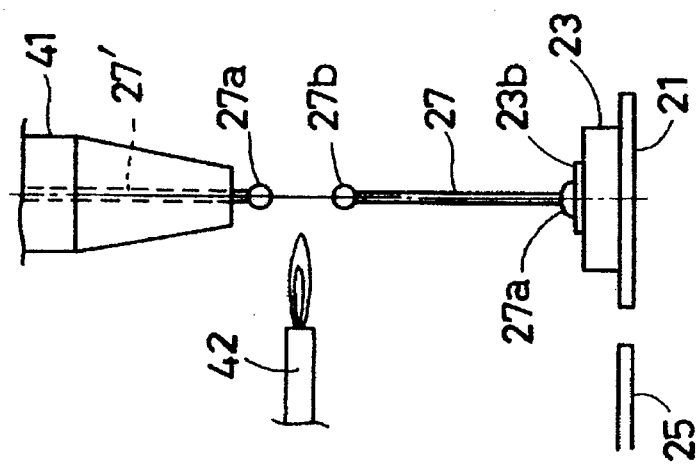

ELECTRONIC COMPONENT INCORPORATING SOLDER FUSE WIRE

CROSS REFERENCE TO PRIOR APPLICATIONS

This is a continuation in part of application Ser. No. 08/209,314 filed Mar. 14, 1994, and now issued as U.S. Pat. No. 5,402,307 which is a continuation of application Ser. No. 08/041,971 filed Apr. 2, 1993 and now issued as U.S. Pat. No. 5,315,474.

BACKGROUND OF THE INVENTION

1. Field of the Invention:

This invention relates to an electronic component of the type which comprises a built-in safety fuse wire electrically connected to a chip element.

2. Description of the Prior Art:

An electronic component having a built-in safety fuse is disclosed for example in "NEC Technical Report" Vol. 44, No. 10/1991, Pages 116–120 or Japanese Patent Application Laid-open No. 2-105513. Such a component is also illustrated in FIGS. 26–28 of the accompanying drawings.

As shown in FIGS. 26–28, the prior art electronic component is a solid electrolytic capacitor comprising a capacitor element 101 which includes a chip body 101a (sintered mass of metal particles) and an anode wire 101b projecting from the chip body. The capacitor further comprises an anode lead 102 electrically connected to the anode wire 101b by welding for example, and a cathode lead 103 electrically connected to the chip body 101a through a fuse wire 104. The fuse wire 104 may be made to break upon overheat in the case of a temperature fuse or upon passage of an overcurrent in the case of an overcurrent fuse.

The fuse wire 104 is partially enclosed in a relatively soft arc-extinguishing member 106 which may be made of silicone resin. The capacitor element 101 together with the fuse wire 104 and part of the respective leads 102, 103 is enclosed in a protective package 105 which is made of a relatively hard resin such as epoxy. The projecting portions of the respective leads 102, 103 are bent to engage the underside of the package 105.

In such a capacitor, one end (first end) 104a of the fuse wire 104 is connected to the cathode lead 103 by causing a bonding tool 107 to press the first end 104a, as best shown in FIG. 28. As a result, the first end 104a is flattened for bonding to the cathode lead 103 with a sufficient adhesion area.

However, the above manner of bonding is disadvantageous in the following respects.

(1) Since the first end 104a of the fuse wire 104 is cross-sectionally reduced due to flattening, the fuse wire 104 tends to become extremely weak near the flattened first end 104a. Thus, at the time of molding the resin package 105, the fuse wire 104 is likely to break near the flattened first end 104a under the influences of the resin injection pressure.

(2) The breaking temperature and/or current of the fuse wire 104 are determined by the cross-sectionally smallest portion of the fuse wire which is located near the flattened first end 104a. Since the degree of flattening cannot be strictly equalized with respect to different fuse wires, it is inevitable that the breaking characteristics of different products varies.

(3) The flattened first end 104a of the fuse wire 104 must have a sufficient length H (see FIG. 26) for providing a sufficient bonding strength. Thus, the bonding portion of the cathode lead 103 must be correspondingly elongated to result in an increase of the length L1 of the capacitor, thereby hindering a reduction in the size and weight of the product.

On the other hand, it is also possible to connect the first end 104a of the fuse wire 104 to the cathode lead 103 by soldering without inviting the problems (1) and (2) described above. However, the soldering operation is relatively time-taking, and the necessity of separately using solder adds to the production cost. Further, the problem (3) above cannot be fully solved by the use of solder.

SUMMARY OF THE INVENTION

It is, therefore, an object of the present invention to provide a chip type electronic component, such as capacitor, transistor or diode, wherein a fuse wire can be electrically connected to both of a chip element and a lead with a sufficient mechanical strength without increasing the bonding length of the fuse wire and without cross-sectionally constricting the fuse wire near its bonding end.

According to the present invention, there is provided an electronic component comprising: at least one chip element having at least two poles; and at least two leads respectively connected electrically to said two poles; wherein at least one of said two leads is electrically connected to a corresponding one of said two poles through a solder fuse wire which has a nail head end and a flattened discal end.

Other objects, features and advantages of the present invention will become apparent from the following detailed description of the preferred embodiments given with reference to the accompanying drawings.

BRIEF DESCRIPTION OF THE DRAWINGS

In the accompanying drawings:

FIGS. 14 through 19 are views showing the successive steps of performing a wire bonding operation for the transistor of the fourth embodiment;

DETAILED DESCRIPTION OF THE PREFERRED EMBODIMENTS

Figure 1:
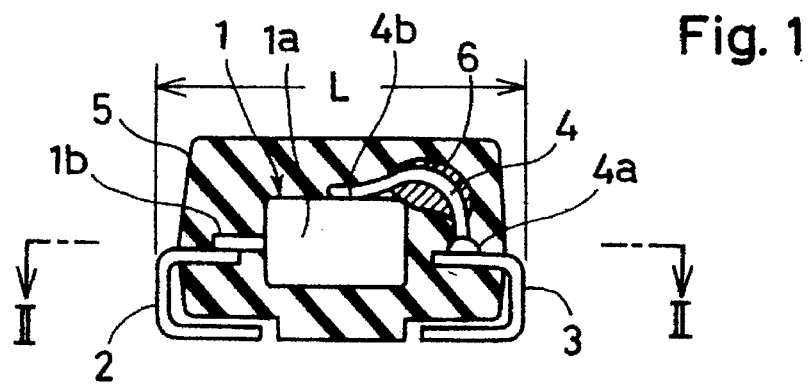
FIG. 1 is a view, in vertical section, showing a solid electrolytic capacitor according to a first embodiment of the present invention.
Figure 2:
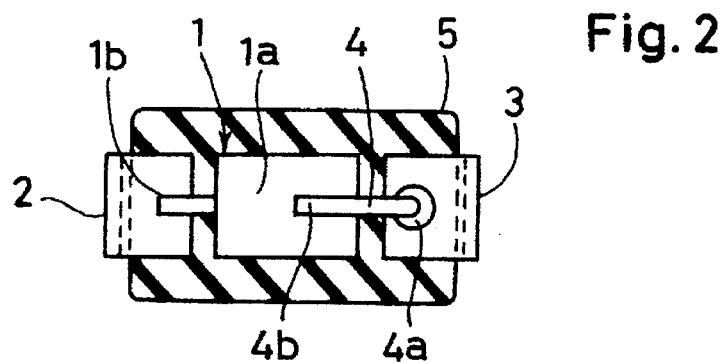
FIG. 2 is a sectional view of the same capacitor taken along lines II—II.
Figure 3:
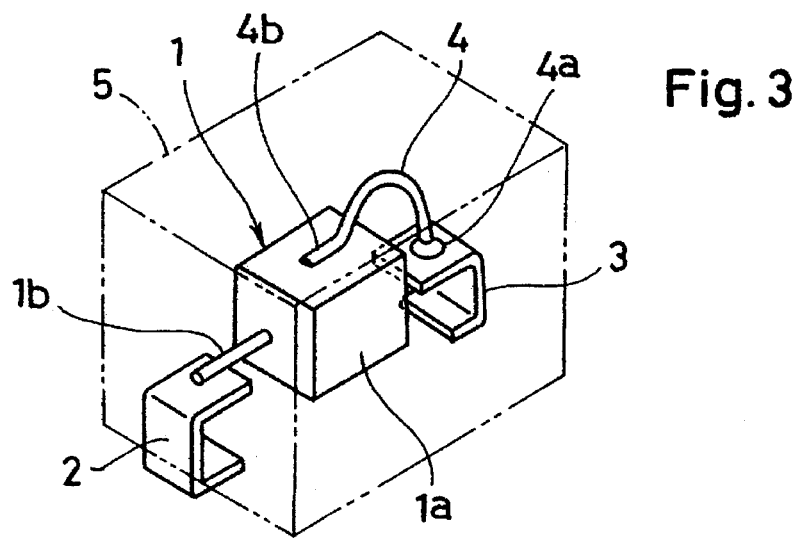
FIG. 3 is a perspective view of the same capacitor.

FIGS. 1 to 3 of the accompanying drawings show a solid electrolytic capacitor according to a first embodiment of the present invention. The capacitor comprises a capacitor element 1 which includes a chip body 1a (sintered mass of metal particles) and an anode wire 1b projecting from the chip body. The capacitor further comprises an anode lead 2 electrically connected to the anode wire 1b by welding for example, and a cathode lead 3 electrically connected to the chip body 1a through a fuse wire 4. The fuse wire 4 is partially enclosed in a relatively soft arc-extinguishing member 6 which may be made of silicone resin.

The capacitor element 1 together with the fuse wire 4 and part of the respective leads 2, 3 is enclosed in a protective package 5 which is made of a relatively hard resin such as epoxy. The projecting portions of the respective leads 2, 3 are bent to engage the underside of the package.

In the first embodiment, the fuse wire 4 is made of solder wherein the proportion of lead (Pb) and tin (Sn) is selected to have a melting point of about 300° C. This melting point is selected so that the fuse wire 4 will break (by melting) at a dangerously high temperature of above 300° C. while preventing breakage under the heat generated at the time of soldering the capacitor to a suitable portion of a printed circuit board (not shown) for die-bonding.

The diameter of the fuse wire 4 may be selected in the range of about 50–120 micrometers depending on the required breaking characteristics. For example, if the fuse wire 4 has a diameter of 80 micrometers, it will break upon passage of 1–2 A current for about 10 seconds. On the other hand, if the fuse wire 4 has a diameter of 120 micrometers, it will break upon passage of 5 A current for about 5 seconds.

According to the first embodiment, one end (first end) 4a of the solder fuse wire 4 is electrically connected to the cathode lead 3 by first forming a ball at the first end 4a and thereafter pressing the ball end against the cathode lead 3 generally perpendicularly thereto but longitudinally of the fuse wire 4 under the application of ultrasonic vibration and/or heat. After connection to the cathode lead 3, the first end 4a of the wire 4 is deformed to have a nail head form.

The other end (second end) 4b of the solder fuse wire 4 may be electrically connected to the chip body 1a by pressing the second end 4b against the chip body 1a under application of ultrasonic vibration and/or heat. Alternatively, the second end 4b of the wire 4 may be connected to the chip body 1a by soldering or by using an electrically conductive paste.

The solid capacitor having the above-described configuration may be manufactured in the following manner.

Figure 4:
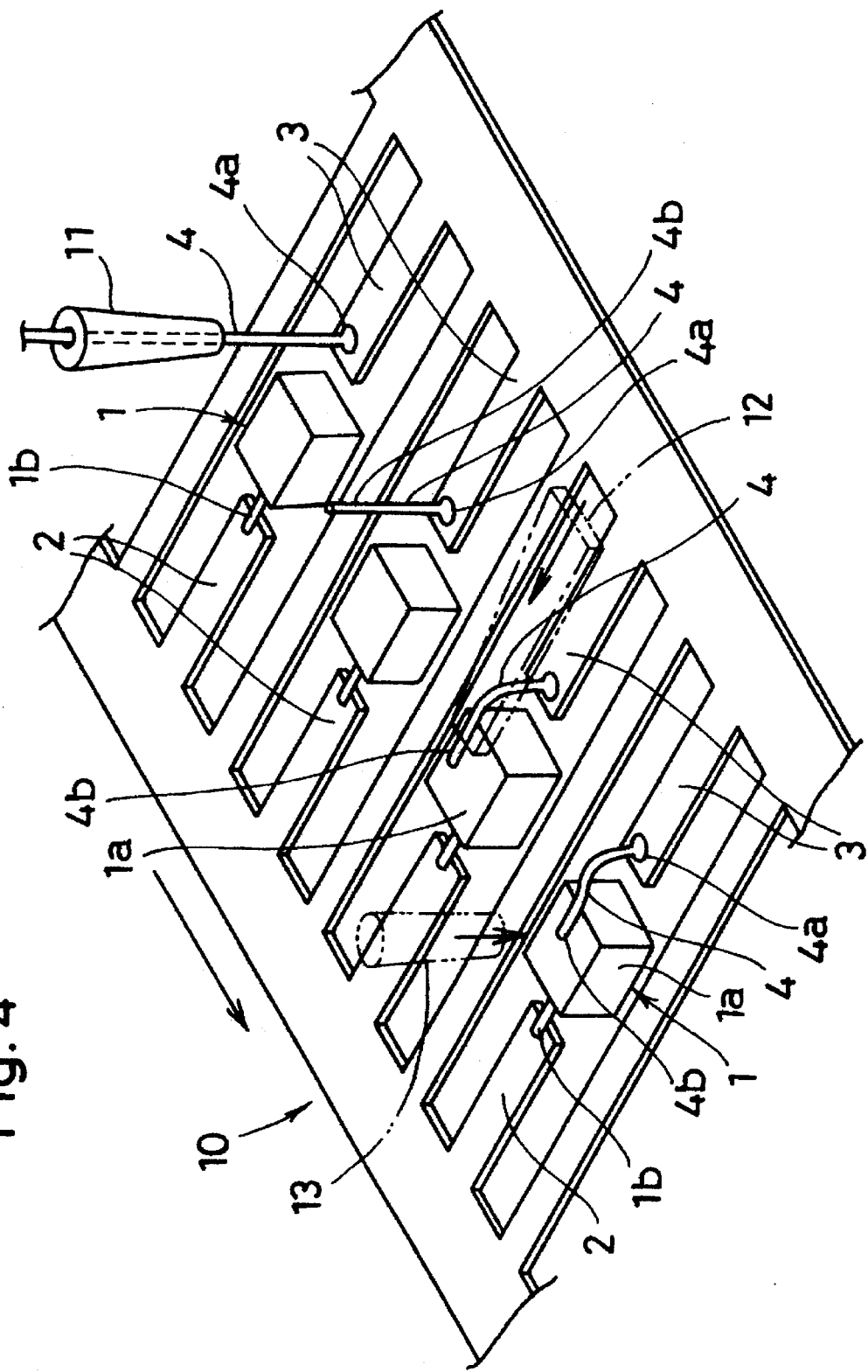
FIG. 4 is a perspective view showing a method of manufacturing the same capacitor.

As shown in FIG. 4, use is made of a leadframe 10 which integrally includes a plurality of anode leads 2 and a plurality of cathode leads 3 paired with the respective anode leads. During longitudinal transfer of the leadframe 10 (indicated by an arrow in FIG. 4), a plurality of capacitor elements 1 are mounted to the leadframe by connecting their respective anode wires 1b to the respective anode leads 2.

Then, a vertically movable capillary tool 11 for supplying a solder fuse wire 4 is arranged immediately above a selected cathode lead 3, as shown at the right-hand position in FIG. 4. The lower end 4a of the fuse wire 4 is made to have a ball formed by thermal melting, and the ball end 4a is pressed against the cathode lead 3 under the application of ultrasonic vibration and/or heat for connection thereto by lowering the capillary tool 11.

Then, the capillary tool 11 is raised while allowing the fuse wire 4 to be paid out. When the capillary tool is raised by a predetermined amount, the fuse wire 4 is cut at a suitable position of the wire to provide an non-connected upper end 4b, and a new ball (not shown) is thermally formed at the lower end of the fuse wire 4 still remaining on the capillary tool 11.

Then, the upper end 4b of the fuse wire 4 is bent toward the chip body 1a of the capacitor element 1 by advancing a bending tool 12 which is movable generally horizontally back and forth.

Then, the upper end 4b of the fuse wire 4 is pressed against the chip body 1a of the capacitor element 1 under the application of ultrasonic vibration and/or heat by lowering a vertically movable bonding tool 13, as shown at the left-hand position in FIG. 4. As a result, the upper end 4b of the fuse wire is electrically bonded to the capacitor chip body 1a.

Finally, the arc-extinguishing member 6 (FIG. 1) and the resin package 5 (also FIG. 1) are formed, and the product is obtained by cutting the respective leads 2, 3 off the leadframe 10.

The solid electrolytic capacitor described above has the following advantages.

First, since the first end 4a of the fuse wire 4 has a nail head form to increase the adhesion area relative to the cathode lead 3 without increasing the length of the first end 4a itself, it is possible to decrease the length of the cathode lead 3, thereby enabling to reduce the length L (FIG. 1) of the capacitor as a whole. Obviously, such a size reduction also contributes to a reduction in the weight and cost of the capacitor.

Secondly, due to the formation of the nail head end 4a, the fuse wire 4 has no cross-sectionally reduced portion which would be easily broken at the time of molding the resin package 5 and which would result in variations of the breaking characteristics. Thus, it is possible to increase the yield of production and equalize the breaking characteristics from product to product.

In the third place, since the fuse wire 4 is made to extend perpendicularly to the cathode lead 3 at a position adjacent to the nail head end 4a, the cathode lead 3 may be located as close to the chip body 1a as possible. Such an arrangement also contributes to a reduction of the length L of the capacitor.

Figure 5:
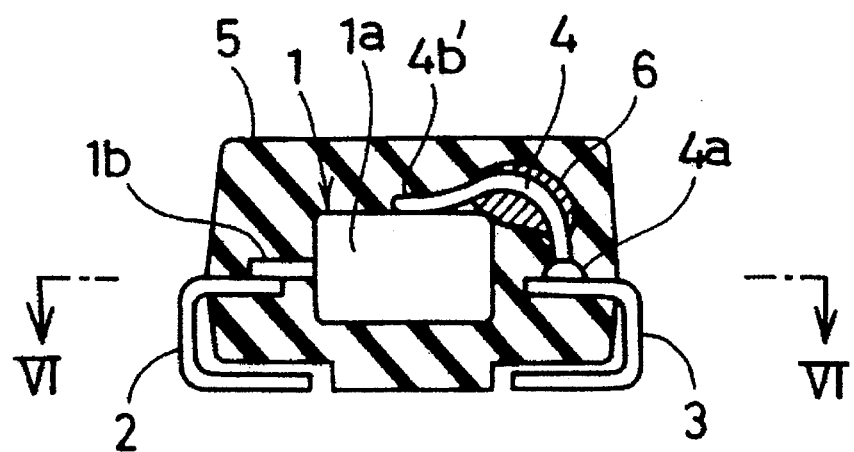
FIG. 5 is a view, in vertical section, showing a solid electrolytic capacitor according to a second embodiment of the present invention.
Figure 6:
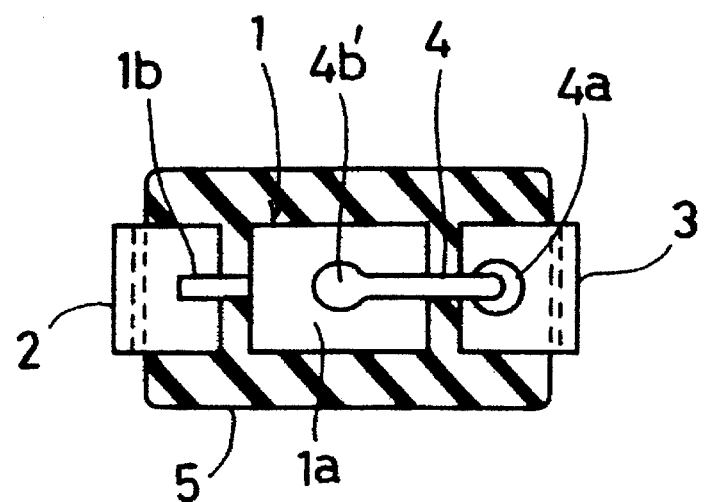
FIG. 6 is a sectional view taken along lines VI—VI in FIG. 5.

FIGS. 5 and 6 show a solid electrolytic capacitor according to a second embodiment of the present invention. The capacitor of the second embodiment is similar to that of the first embodiment but differs therefrom only in that the fuse wire 4 has an enlarged, generally discal end (second end) 4b' for electrical connection to the capacitor chip body 1a in addition to the enlarged nail head end (first end) 4a for electrical connection to the cathode lead 3.

The bonding of the fuse wire 4 may be preferably performed in the following manner.

Figure 7:
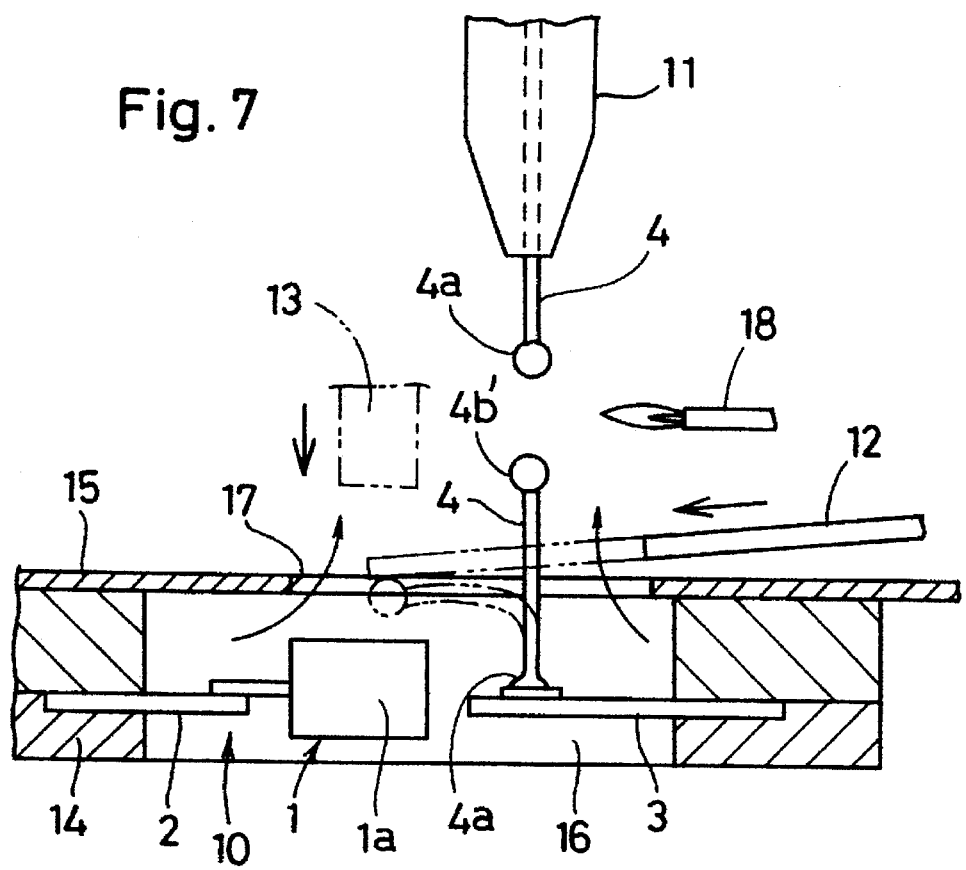
FIGS. 7 and 8 are views showing a method of making the capacitor shown in FIG. 5.
Figure 8:
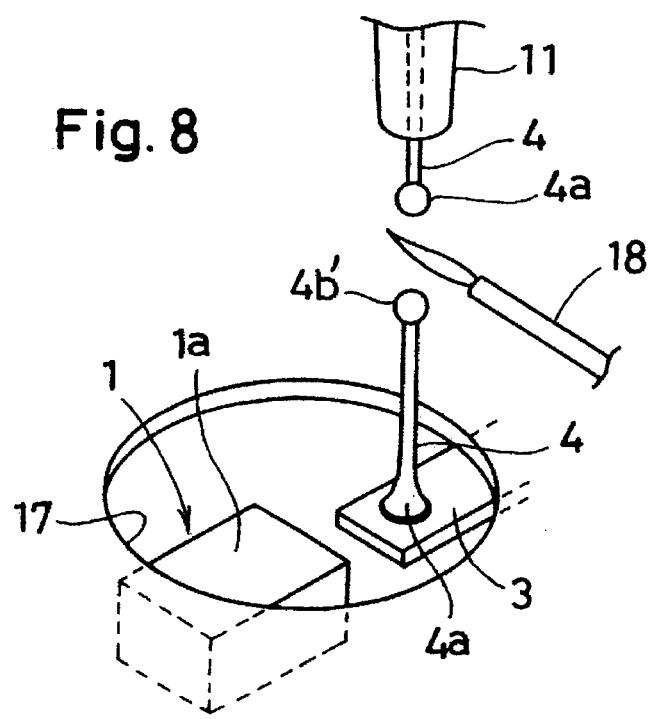

As shown in FIGS. 7 and 8, a combination of a heater block 14 and a cover plate 15 is used for bonding the fuse wire 4 to a selected cathode lead 3 of a leadframe 10 and to a corresponding capacitor chip body 1a. The heater block 14 has a tunnel 16 in which the capacitor element 1 fixed to the leadframe 10 is arranged, whereas the cover plate 15 has an opening 17 communicating with the tunnel 16. Above the opening 17, there are arranged a capillary tool 11 for continuously supplying a solder fuse wire 4, a bending tool 12, a bonding tool 13, and a torch 18.

During the bonding operation, a reducing gas (containing nitrogen gas mixed with about 4–5% of hydrogen gas for example) or an inert gas (containing only nitrogen gas for example) is supplied to the tunnel 16 of the heater block 14 from below for discharging through the opening 17 of the cover plate 15, so that a reducing or inert atmosphere is created immediately above the opening 17. In this condition, the lower end 4a of the fuse wire 4, which has been previously melted into a ball, is first bonded to the cathode lead 3 by lowering the capillary tool 11 for pressing the ball end 4a to the cathode lead 3 under application of heat (provided by the heater block 14) and/or ultrasonic vibration.

Then, the capillary tool 11 is raised while allowing the fuse wire 4 to be paid out. When the capillary tool is raised by a predetermined amount, the torch 18 is brought closer to the fuse wire 4 for thermal cutting thereof. As a result, the shorter portion of the fuse wire 4 connected to the cathode lead 3 is made to have an upper ball end 4b', whereas the other portion of the fuse wire 4 still remaining on the capillary tool 11 is made to have a lower new ball end 4a. Obviously, the new ball end 4a is used for bonding to the next cathode lead (not shown).

Then, the upper ball end 4b' of the shorter fuse wire 4 is bent toward the chip body 1a of the capacitor element 1 by advancing the bending tool 12 generally horizontally, as indicated by phantom lines in FIG. 7.

Then, the upper ball end 4b' of the shorter fuse wire 4 is pressed against the chip body 1a of the capacitor element 1 under application of heat and/or ultrasonic vibration by the vertically movable bonding tool 13. As a result, the upper ball end 4b' of the shorter fuse wire 4 is flattened into a generally discal form for electrically bonding to the capacitor chip body 1a (see FIG. 6).

Figure 9:
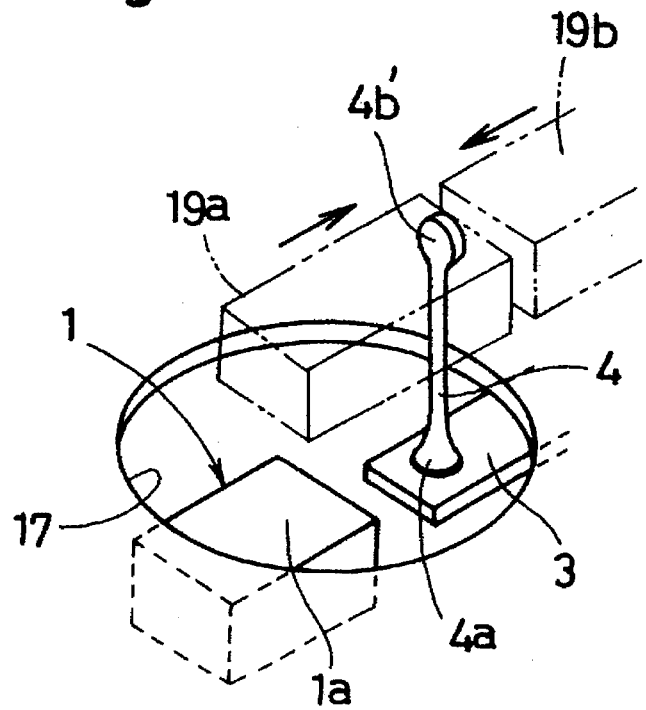
FIGS. 9 and 10 are views showing another method of making the capacitor shown in FIG. 5.

Instead of immediately pressing against the cathode lead 3, the upper ball end 4b' of the fuse wire 4 may be first flattened into a discal form by compressing between a pair of clamp members 19a, 19b, as shown in FIG. 9. Thereafter, the flattened discal end 4b' is brought toward the capacitor chip body 1a by advancing the bending tool 12 (FIG. 7) and pressed against the chip body 1a for bonding thereto by lowering the bonding tool 13 (also FIG. 7), as shown in FIG. 10.

In either of the two bonding methods illustrated in FIGS. 7 to 10, the discal end 4b' of the fuse wire 4 for bonding to the capacitor chip body 1a is formed by flattening the upper ball end of the wire. Obviously, the discal wire end 4b' provides an increased adhesion area as required for insuring a sufficient bonding strength. In addition, it is unnecessary to separately use solder or conductive paste for electrical connection, thereby facilitating the bonding operation and reducing the production cost.

Further, despite flattening for increasing the adhesion area, the thickness D1 (see FIG. 10) of the discal wire end 4b' can be rendered generally equal to the diameter D2 of the fuse wire 4 due to the utilization of the ball end. Thus, near the discal end 4b', the fuse wire 4 will have no cross-sectionally reduced portion which would be easily broken at the time of molding the resin package 5 (FIG. 5) and which would result in variations of the breaking characteristics.

Figure 10:
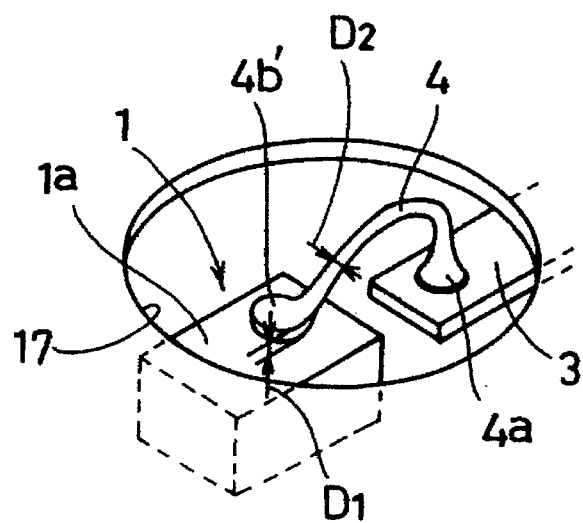

In the bonding method illustrated in FIGS. 9 and 10, the upper ball end 4b' of the fuse wire 4 is flattened before bonding to the capacitor chip body 1a. Thus, the subsequent bonding of the thus flattened discal end 4b' of the fuse wire 4' relative to the capacitor chip body 1a can be performed with a smaller bonding force than required for flattening the wire ball end simultaneously with bonding to the chip body. As a result, the chip body 1a, which is a sintered mass of metal particles, is less likely to be damaged (e.g. material chipping or crack formation) at the time of bonding the fuse wire 4.

Figure 11:
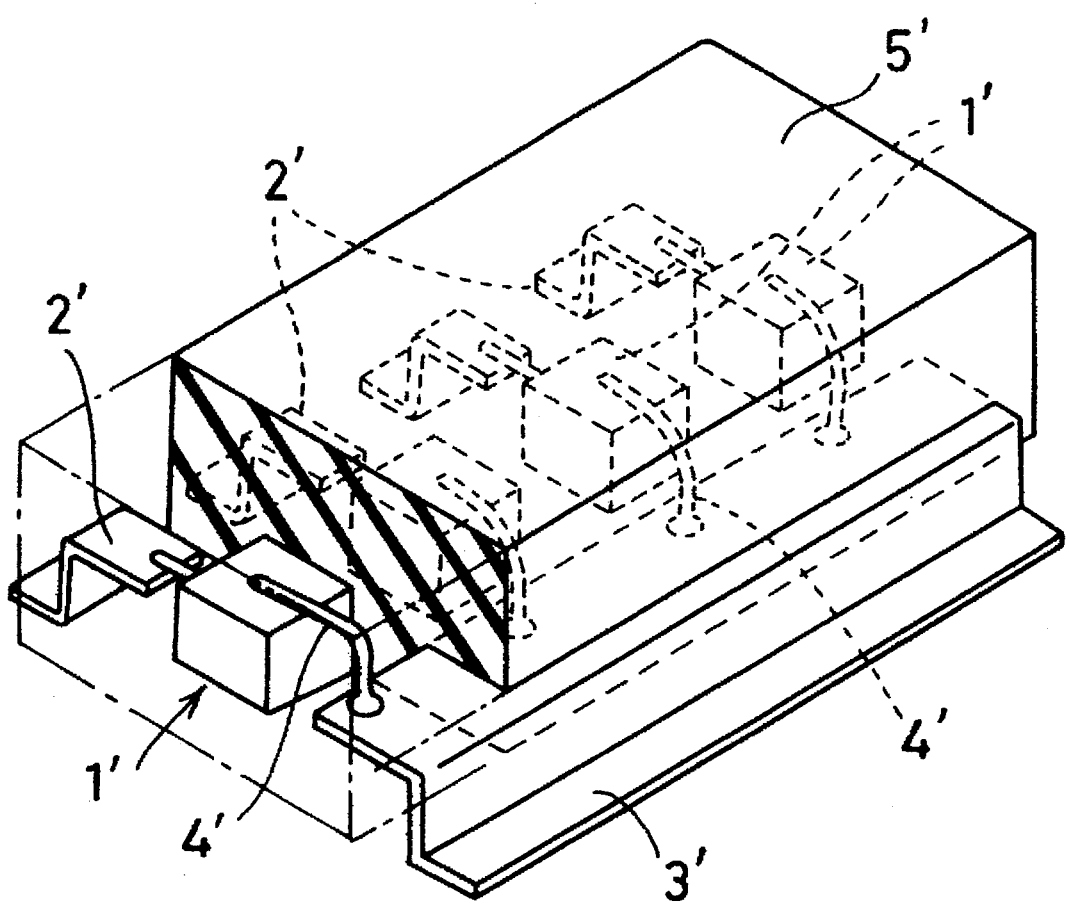
FIG. 11 is a perspective view showing a collective-type solid electrolytic capacitor according to a third embodiment of the present invention.

The present invention may be applied to a collective-type solid electrolytic capacitor (third embodiment), as shown in FIG. 11. More specifically, the collective-type capacitor includes a plurality of capacitor elements 1' arranged in parallel to each other and enclosed in a common resin package 5'. The respective capacitor elements 1' may differ from each other in capacitance. Alternatively, all of the capacitor elements may have an equal capacitance.

The collective-type capacitor of FIG. 11 is shown to include separate anode leads 2' for the respective capacitor elements 1' but a common cathode lead 3' for electrical connection to the respective capacitor elements through separate fuse wires 4'. Alternatively, use may be made of a common anode lead for all of the capacitor elements 1' and separate cathode leads for the respective capacitor elements.

Figure 12:
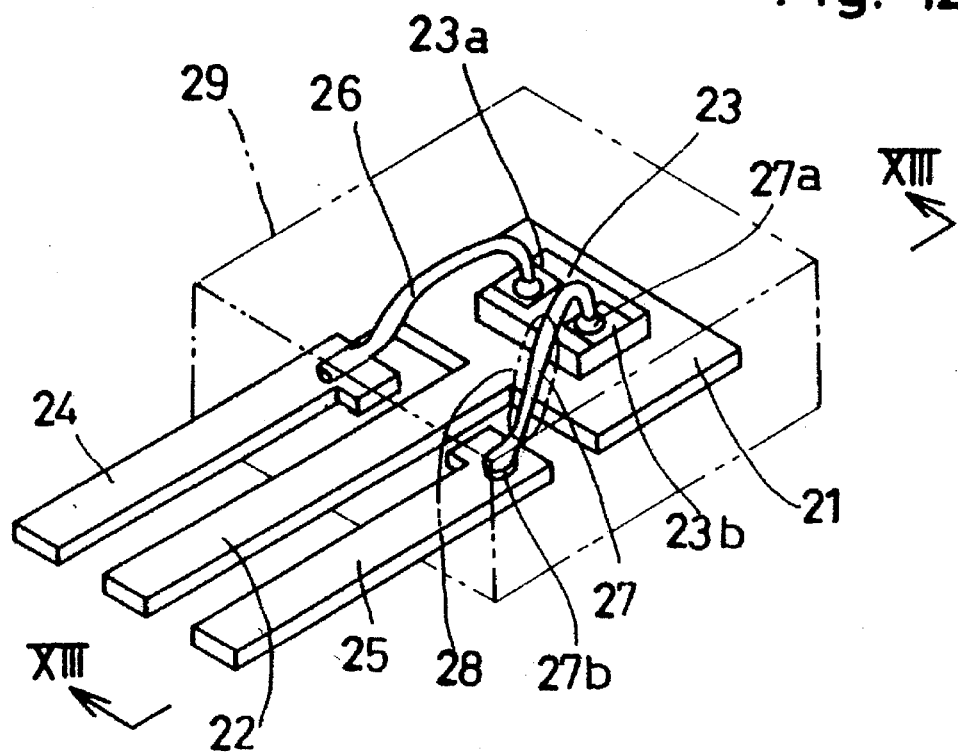
FIG. 12 is a perspective view showing a high output transistor according to a fourth embodiment of the present invention.
Figure 13:
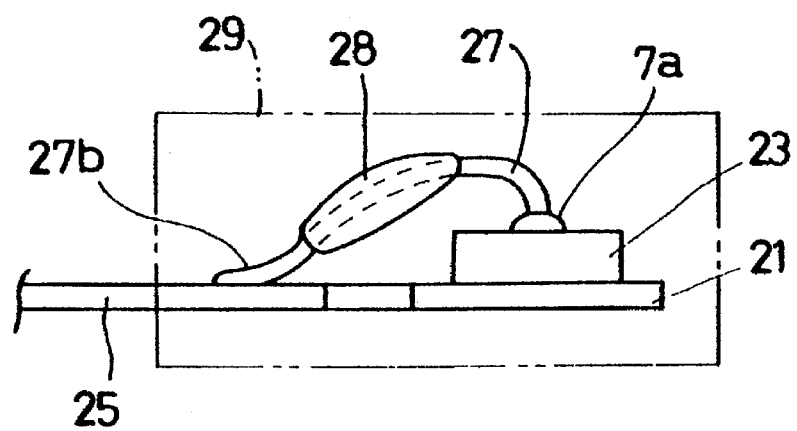
FIG. 13 is a view of the same transistor as seen in the direction of arrows XIII—XIII in FIG. 12.

FIGS. 12 and 13 of the accompanying drawings show a high output transistor as a fourth embodiment of the present invention. The transistor comprises a metal base plate 21 having an integral base lead 22 and carrying a semiconductor chip 23 (transistor element) with its base pole held in electrical contact with the base plate 21. The chip 23 has an emitter electrode 23a and a collector electrode 23b.

The base lead 22 of the base plate 21 is flanked by an plate-like emitter lead 24 and a plate-like collector lead 25, both of which are made of a metal. The emitter lead 24 has an inner end electrically connected to the emitter electrode 23a of the chip 23 through a high melting point metal wire 26, whereas the collector lead 25 has an inner end electrically connected to the collector electrode 23b of the chip 23 through a solder wire 27. The high melting point metal wire 26 may be made of gold (Au), aluminum (Al) or copper (Cu) for example. The solder wire 27, which may be made of palladium or silver containing solder, works as a temperature fuse due to its low melting point. Preferably, an intermediate portion of the solder wire 27 may be enclosed in a relatively soft arc-extinguishing member 28 which may be made of silicone resin.

The base plate 21, the semiconductor chip 23, part of the base lead 22, part of the emitter lead 24 and part of the collector lead 25 are enclosed in a protective package 29 which is made of a relatively hard resin such as epoxy.

Bonding of the solder wire 27 to the collector electrode 23b of the semiconductor chip 23 and to the inner end of the collector lead 25 may be preferably performed in the following manner.

First, as shown in FIG. 14, a vertically movable capillary tool 41 for continuously supplying a solder wire 27' is arranged immediately above the collector electrode 23b of the semiconductor chip 23. The lower end 27a of the solder wire 27' is made to have a ball formed by thermal melting.

Then, as shown in FIG. 15, the capillary tool 41 is lowered for pressing the ball end 27a axially of the solder wire 27' against the collector electrode 23b under the application of ultrasonic vibration. As a result, the solder wire ball end 27a is deformed into a nail head for connection to the collector electrode 23b. The application of ultrasonic vibration shortens the time required for such connection.

Figure 17:
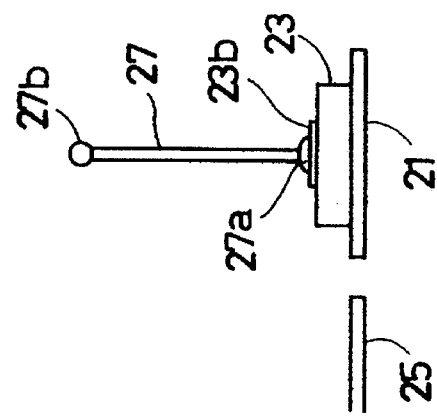

Then, as shown in FIG. 16, the capillary tool 41 is raised while allowing the solder wire 27' to be paid out. When the capillary tool 41 is raised by a predetermined amount, the solder wire 27' is cut by a thermal melting means 42 (e.g. hydrogen gas burner) at a suitable position of the wire to provide a solder wire segment 27 which has a non-connected upper ball end 7b' (see also FIG. 17). At the same time, a new ball is thermally formed at the new lower end 27a of the solder wire 27 still remaining on the capillary tool 41. The formation of the ball ends 27a, 27b need be performed in an oxygen-free gas stream, as previously described in connection with FIGS. 7–10.

Figure 18:
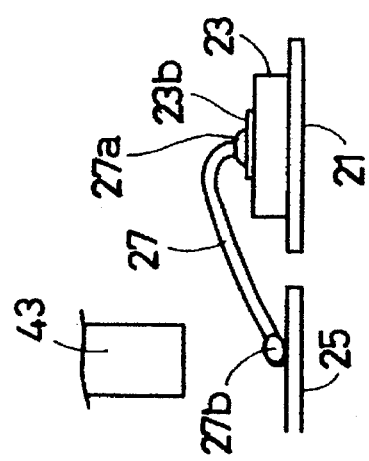

Then, as shown in FIG. 18, the upper ball end 27b of the solder wire 27 is bent toward the inner end of the collector lead 25 by advancing a bending tool (not shown).

Figure 19:
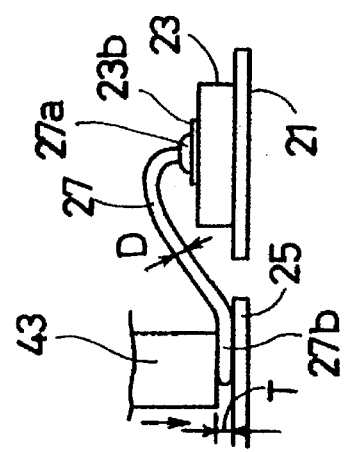

Then, as shown in FIG. 19, the upper ball end 27b of the solder wire 27 is pressed transversely of the wire 27 against the collector lead 25 under the application of ultrasonic vibration by lowering a vertically movable bonding tool 43. Such pressing of the upper ball end 27b is performed until the ball 27b is flattened into a discal form to have a thickness T which is substantially equal to the normal diameter D of the solder wire 27. As a result, the upper end 27b of the solder wire 27 is electrically bonded to the collector lead 25. Apparently, the application of ultrasonic vibration shortens the time required for wire bonding.

Due to the formation of the upper ball end 27b which is subsequently flattened for bonding, the solder wire 27 (solder wire segment) is prevented from being cross-sectionally constricted. Further, the flattened discal end 27b of the solder wire 27 provides an increased adhesion area relative to the collector lead 25.

In use, the high output transistor having the above-described arrangement may be incorporated in a load circuit. When an electrical signal is applied through the base lead 22, the emitter lead 24 (namely, the emitter of the transistor) conducts with the collector lead 25 (namely, the collector of the transistor). In this condition, if a high power (caused by a large current or a high voltage) is applied to the semiconductor chip 23 due to shorting in the load circuit for example, the chip 23 generates a lot of heat which causes thermal melting of the solder wire 27'. As a result, the load circuit is rendered open, and various components incorporated in the load circuit are prevented from secondarily damaged by the heat.

Apparently, the high melting point metal wire 26 and the solder wire 27 may be exchanged with each other in arrangement. Specifically, the high melting point metal wire 26 may be arranged to electrically connect between the collector electrode 23b of the semiconductor chip 23 and the collector lead 25, whereas the solder wire 27 may be arranged to electrically connect between the emitter electrode 23a of the chip 23 and the emitter lead 24.

Figure 20:
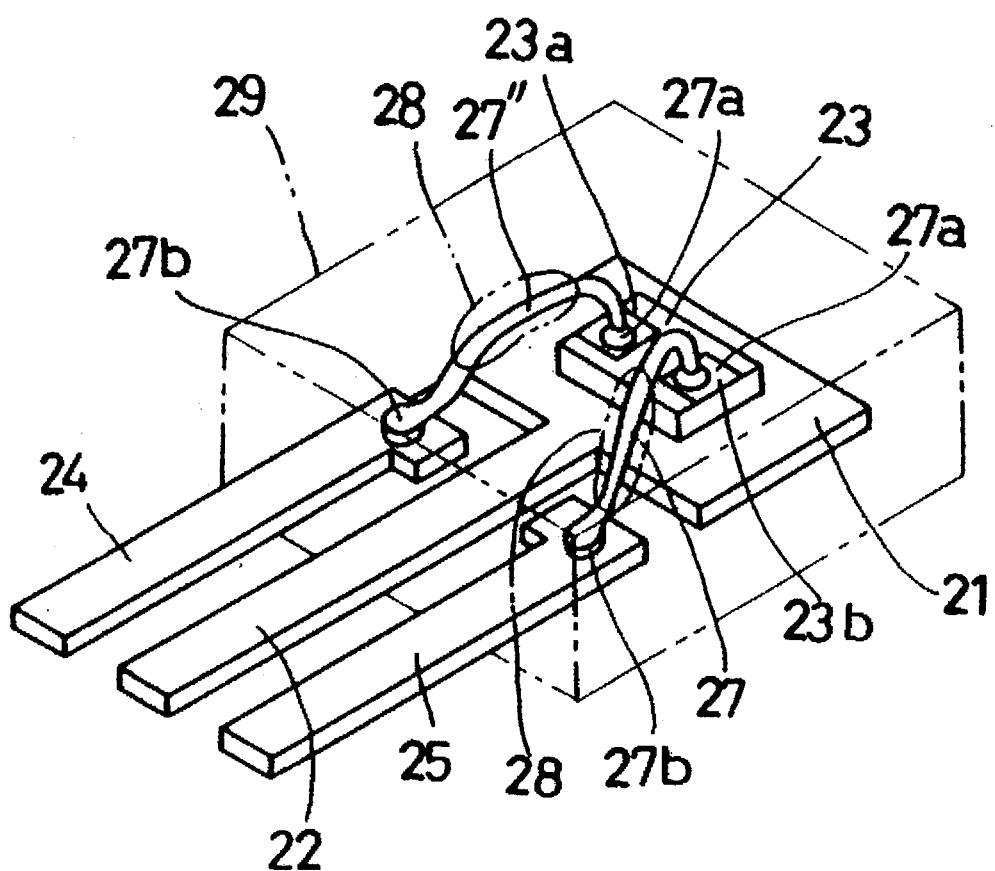
FIG. 20 is a perspective view showing a high output transistor according to a fifth embodiment of the present invention.

FIG. 20 shows another high output transistor as a fifth embodiment of the present invention. The transistor of the fifth embodiment is similar to that of the fourth embodiment but differs therefrom only in that a second solder wire 27" is provided for electrically connecting between the emitter electrode 23a of the semiconductor chip 23 and the emitter lead 24 in addition to a first solder wire 27 which connects between the collector electrode 23b of the chip 23 and the collector lead 25. Like the first solder wire 27, an intermediate portion of the second solder wire 27" is also enclosed in a relatively soft arc-extinguishing member 28 which may be made of silicone resin.

Obviously, wire bonding each of the first and second solder wires 27, 27" may be performed substantially in the same manner as previously described for the fourth embodiment. In so doing, use is made of a leadframe 44 which integrally carries plural groups of leads 22, 24, 25 associated with a plurality of semiconductor chips 23, as shown in FIG. 21.

Figure 21:
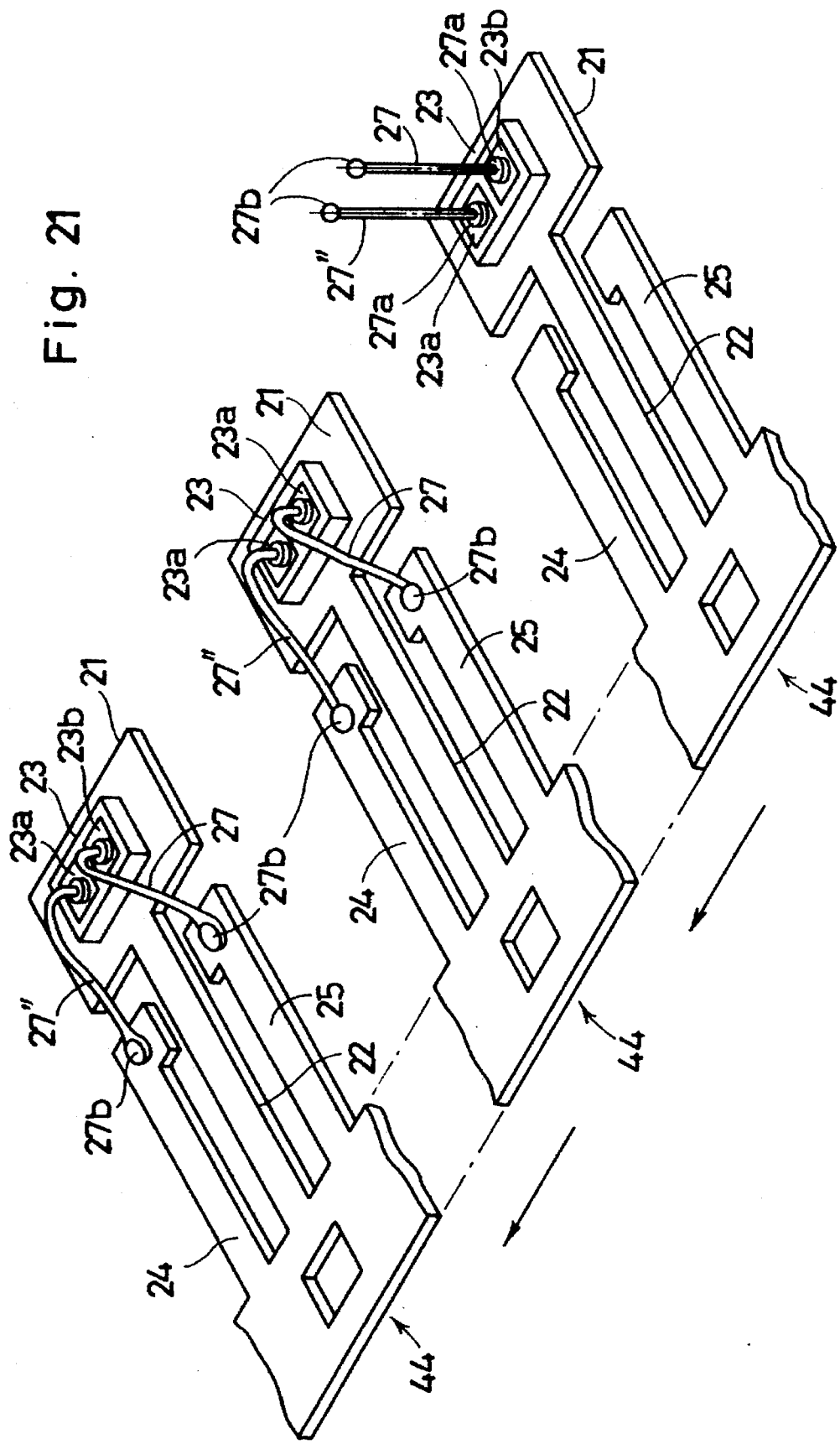
FIG. 21 is a perspective view showing the successive steps of performing a wire bonding operation for the transistor of the fifth embodiment.

Specifically, a first bonding step is initially performed for bonding the respective lower ball ends 27a of the first and second solder wires 27, 27" to each semiconductor chip 23 (see the right-hand chip in FIG. 21). Then, a bending step is performed for bending the first and second solder wires 27, 27" toward the emitter and collector leads 24, 25, respectively, for the corresponding semiconductor chip 23 (see the middle chip in FIG. 21). Finally, a second bonding step is then performed for bonding the respective upper ends 27b of the first and second solder wires 27, 27" to the emitter and collector leads 24, 25, respectively, for the semiconductor chip 23 (see the left-hand chip in FIG. 21).

According to the second embodiment, the first bonding step for one semiconductor chip (the right-hand one in FIG. 21 for example), the bending step for another semiconductor chip (the middle one in FIG. 21 for example), and the second bonding step for a further semiconductor chip (the left-hand one in FIG. 21 for example) may be all performed simultaneously because all these steps require different tools (a capillary tool, a bending tool and a bonding tool). As a result, the time required for performing the entire wire bonding process of the leadframe 44 can be shortened.

Figure 22:
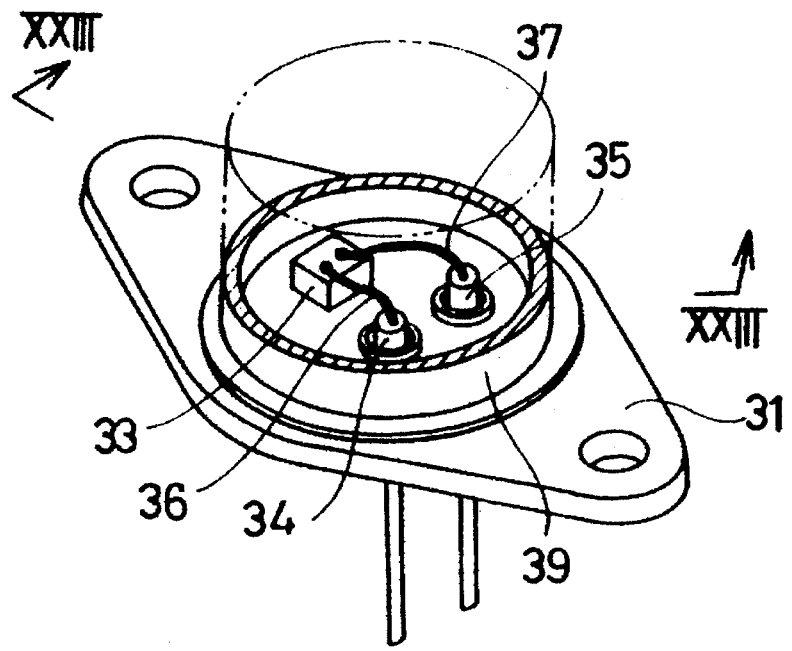
FIG. 22 is a perspective view showing a high output transistor according to a sixth embodiment of the present invention.
Figure 23:
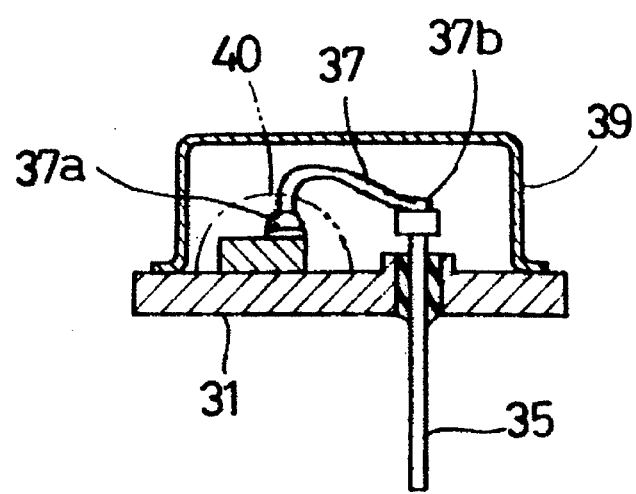
FIG. 23 is a sectional view taken along lines XXIII—XXIII in FIG. 22.

FIGS. 22 and 23 show a further high output transistor as a sixth embodiment of the present invention. The transistor of the sixth embodiment comprises a metal base plate 31 which is rendered relatively large to work as a heat sink. Further, the base plate 31 also works as a base lead. A semiconductor chip 33 (transistor element) is bonded on the base plate 31 with its base pole held in electrical contact with the base plate 31. The chip 33 has an emitter electrode (not distinctly shown) and a collector electrode (not distinctly shown).

The base plate 31 is penetrated by an emitter lead 34 and a collector lead 35. Each of the emitter and collector leads 34, 35 is insulated from the base plate 31 by an insulating member 32.

The emitter lead 34 has an inner end electrically connected to the emitter electrode of the semiconductor chip 33 through a high melting point metal wire 36 made of gold (Au), aluminum (Al) or copper (Cu) for example, whereas the collector lead 35 has an inner end electrically connected to the collector electrode of the chip 33 through a solder wire 37. The solder wire 37 has a nail head 37a for bonding to the chip 33, and a flattened discal end 37b for bonding to the collector lead 35. Apparently, the bonding process for the solder wire 37 can be performed substantially in the same manner as illustrated in FIGS. 14–19.

The semiconductor chip 33, part of the emitter lead 34 and part of the collector lead 35 are enclosed in a metal cap 39 attached to the base plate 31. Indicated by reference numeral 40 in FIG. 23 is a protective resin body for enclosing the semiconductor chip 33.

In the sixth embodiment of FIGS. 22 and 23, the high melting point metal wire 36 and the solder wire 37 may be exchanged with each other in arrangement, so that the high melting point metal wire 36 electrically connects between the collector electrode of the semiconductor chip 33 and the collector lead 35, whereas the solder wire 37 electrically connects between the emitter electrode of the chip 33 and the emitter lead 34. Further, the high melting point metal wire 36 may be replaced by another solder wire.

The present invention is not limited to high output transistors. Indeed, the present invention may be applied to various types of transistors such as MOS transistors and field effect transistors. Further, the present invention is also applicable to other semiconductor chip type electronic components such as thyristors, reverse blocking triode thyristors and triacs.

Figure 24:
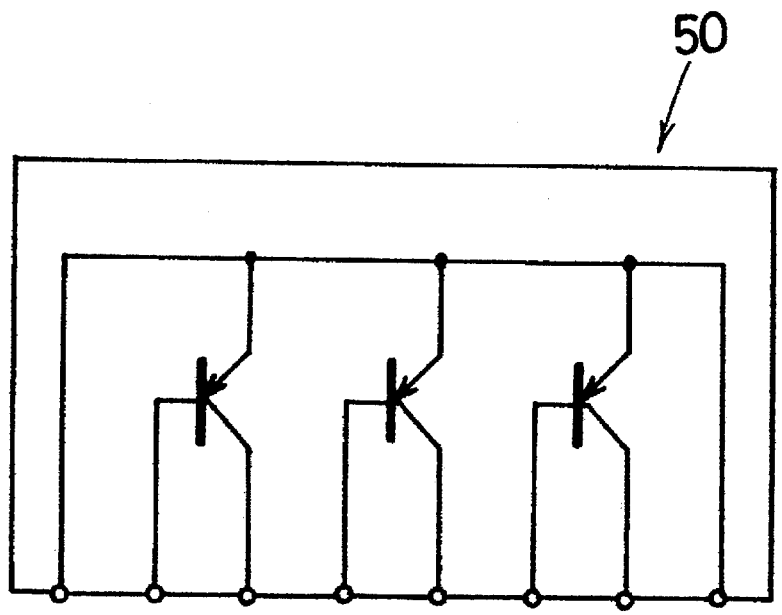
FIG. 24 is an equivalent circuit diagram showing a transistor array to which the present invention may be applied.
Figure 25:
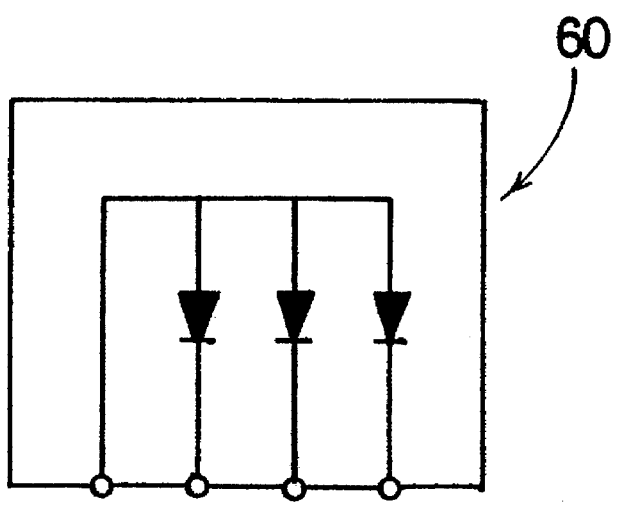
FIG. 25 is an equivalent circuit diagram showing a diode array to which the present invention may be applied.
Figure 26:
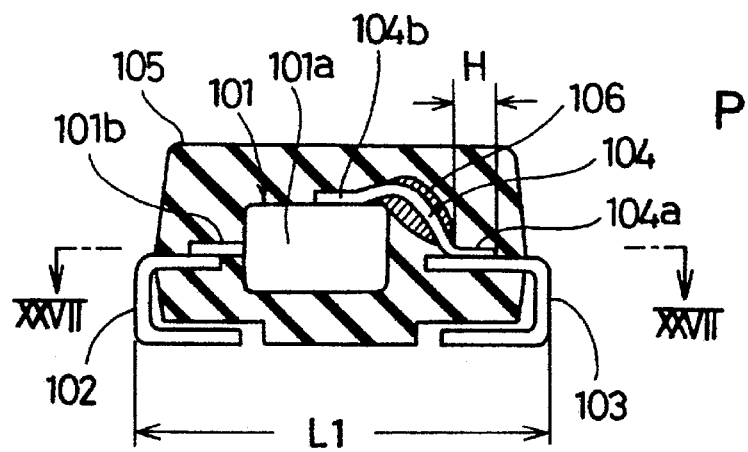
FIG. 26 is a view, in vertical section, showing a prior art solid electrolytic capacitor.
Figure 27:
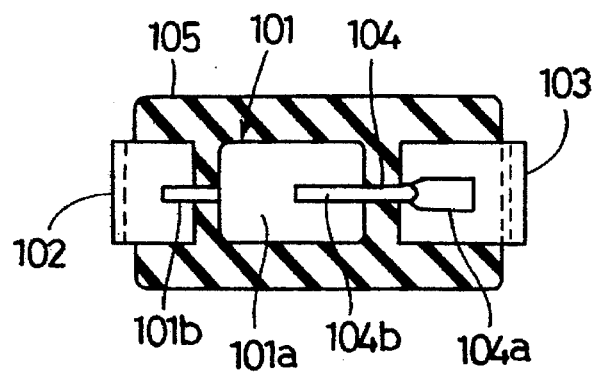
FIG. 27 is a sectional view taken along lines XXVII—XXVII in FIG. 26.
Figure 28:
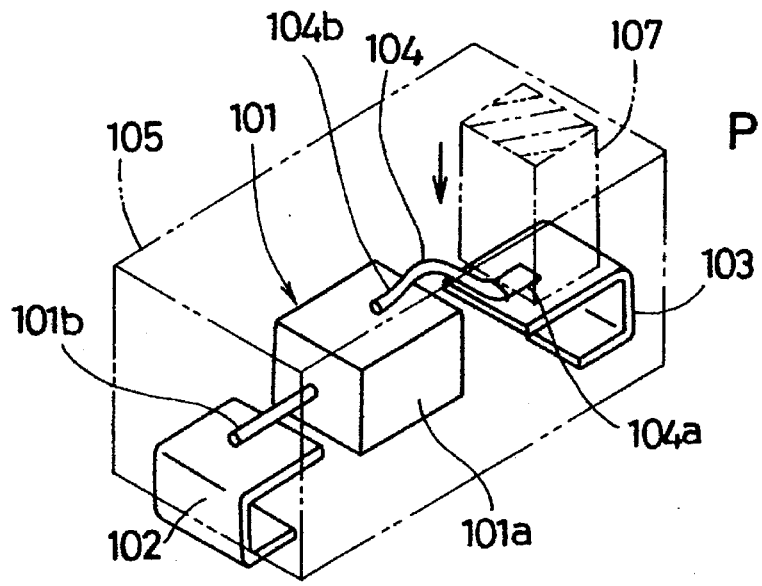
FIG. 28 is a perspective view of the same prior art capacitor.

Further, as shown in FIG. 24, the present invention is additionally applicable to a transistor array 50 wherein a single semiconductor chip carries a plurality of transistor elements. Similarly, the present invention may be applied to a diode array 60 wherein a single semiconductor chip carries a plurality of diode elements, as shown in FIG. 25.

The preferred embodiments of the present invention being thus described, it is obvious that the same may be varied in many ways. Such variations are not to be regarded as a departure from the spirit and scope of the the invention, and all such modifications as would be obvious to those skilled in the art are intended to be included within the scope of the following claims.

I claim:

1. An electronic component comprising:
   at least one chip element having at least two poles; and
   at least two leads respectively connected electrically to said two poles;
   wherein at least one of said two leads is electrically connected to a corresponding one of said two poles through a solder fuse wire which has a nail head end and a flattened discal end.

2. The electronic component according to claim 1, wherein the other of said two leads is electrically connected to a corresponding one of said two poles through a high melting point metal wire.

3. The electronic component according to claim 1, wherein the other of said two leads is also electrically connected to a corresponding one of said two poles through another solder wire which has a nail head end and a flattened discal end.

4. The electronic component according to claim 1, wherein the nail head of the solder wire is bonded to the chip element, whereas the flattened discal end of the solder wire is bonded to the corresponding one of said two leads.

5. The electronic component according to claim 1, wherein the chip element is a semiconductor transistor chip.

6. The electronic component according to claim 1, wherein the chip element is a high output semiconductor transistor chip.

7. The electronic component according to claim 1, wherein the chip element carries a transistor array comprising a plurality of transistors.

8. The electronic component according to claim 1, wherein the chip element carries a diode array comprising a plurality of diodes.

* * * * *